United States Patent
Doshi et al.

(10) Patent No.: US 6,174,817 B1
(45) Date of Patent: *Jan. 16, 2001

(54) TWO STEP OXIDE REMOVAL FOR MEMORY CELLS

(75) Inventors: Vikram N. Doshi; Hiro Tomomatsu, both of Plano; Roy D. Clark, Princeton; Richard L. Guldi, Dallas, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/140,578

(22) Filed: Aug. 26, 1998

Related U.S. Application Data

(60) Provisional application No. 60/057,742, filed on Aug. 28, 1997.

(51) Int. Cl.[7] ................................................... H01L 21/30
(52) U.S. Cl. ........................ 438/706; 438/704; 438/712; 438/714; 438/720
(58) Field of Search ................................... 438/710, 706, 438/712, 714, 719, 723, 734, 704, 735; 134/1.2

(56) References Cited

U.S. PATENT DOCUMENTS

| | | | |
|---|---|---|---|
| Re. 36,006 | * 12/1998 | Bohannon et al. | 438/734 |
| 4,368,220 | 1/1983 | Eldridge et al. | 427/255.4 |

(List continued on next page.)

FOREIGN PATENT DOCUMENTS 61-4232   1/1986   (JP) .

OTHER PUBLICATIONS

Fred R. Clayton and Shirley A. Beeson, High–Rate Anisotropic Etching of Aluminum on a Single–Wafer Reactive Ion Etcher, Jul. 1993, Solid State Technology, pp. 93–97.

Brynee K. Bohannon and Brian Scott Poarch, The Removal of Reactive Ion Etch Residues, pp. 1–12.

Susan Budavari, et al., The Merck Index, 1989, p. 9.

Toru Kaga, et al., Crown–Shaped Stacked–Capacitor Cell for 1.5–V Operation 64–Mb DRAM's, vol. 38, No. 2, Feb. 1991, pp. 255–261.

D. E. Kotecki and K. L. Saenger, Fabrication Process for Container and Crown Electrodes in Memory Devices, IBM Technical Disclosure Bulletin, vol. 38, No. 11, Nov. 1995, pp. 197–199.

(List continued on next page.)

*Primary Examiner*—Robert Kunemund
*Assistant Examiner*—Lan Vinh
(74) *Attorney, Agent, or Firm*—Robby T. Holland; Wade James Brady, III; Frederick J. Telecky, Jr.

(57) ABSTRACT

Hydrofluoric acid (HF) mixed with water and often buffered with ammonium fluoride is a standard silicon dioxide wet etchant which is followed by a rinse. An improved silicon dioxide etch is vapor HF which may be followed by a water vapor rinse. The invention discloses a further improved silicon dioxide etch. Following an initial exposure to vapor HF for oxide removal, a first insitu water rinse occurs. A second exposure to vapor HF then occurs and is followed by a second insitu water rinse. Water, rather than water vapor, aids in freeing particles from the wafer surface. During both the water rinses, the wafer may be rotated at increasing speeds to aid in sweeping particles from wafer surface. The process may be practiced in a commercially available reactor and is suitable for ULSI devices having complex topographies, such as, for example, 64 megabit DRAMs employing crown type memory cells.

12 Claims, 3 Drawing Sheets

U.S. PATENT DOCUMENTS

| | | | |
|---|---|---|---|
| 4,668,335 | 5/1987 | Mockler et al. | 156/643 |
| 4,749,440 * | 6/1988 | Blackwood et al. | 156/646 |
| 5,044,314 * | 9/1991 | McNeilly | 118/717 |
| 5,089,084 | 2/1992 | Chhabra et al. | 156/646 |
| 5,162,248 | 11/1992 | Dennison et al. | 437/52 |
| 5,174,816 | 12/1992 | Aoyama et al. | 106/203 |
| 5,200,361 * | 4/1993 | Onishi | 437/195 |
| 5,213,622 | 5/1993 | Bohling et al. | 134/3 |
| 5,238,862 | 8/1993 | Blalock et al. | 437/52 |
| 5,270,241 | 12/1993 | Dennison et al. | 437/52 |
| 5,278,091 | 1/1994 | Fazan et al. | 437/52 |
| 5,286,677 * | 2/1994 | Wu | 437/47 |
| 5,354,705 | 10/1994 | Mathews et al. | 437/52 |
| 5,491,103 | 2/1996 | Ahn et al. | 437/52 |
| 5,545,582 | 8/1996 | Roh | 437/52 |
| 5,604,147 | 2/1997 | Fischer et al. | 437/60 |
| 5,612,241 | 3/1997 | Arima | 437/52 |
| 5,679,171 * | 10/1997 | Saga et al. | 134/3 |
| 5,744,402 * | 4/1998 | Fukazawa et al. | 438/734 |
| 5,821,140 * | 10/1998 | Jost et al. | 438/241 |
| 5,882,433 * | 3/1999 | Ueno | 134/31 |

OTHER PUBLICATIONS

G. Cameron and A. Chambers, Vacuum & Thin Film Technology Successfully Addressing Post–Etch Corrosion, May 1989, pp. 142–147.

Brynne K. Bohannon, R. Allen Bowling, and Brian S. Poarch, Post Metal Etch Residue Removal Using Vapor Phase Processing Technology, pp. 1–7.

Heidi L. Denton and Robert M. Wallace, Controlling Polymer Formation During Polysilicon Etching In A Magnetically–enhanced Reactive Ion Etcher, pp. 1–9.

* cited by examiner

TWO STEP OXIDE REMOVAL FOR MEMORY CELLS

This application claims priority under 35 USC 119(e)(1) of provisional application number 60/057,742 filed on Aug. 28, 1997.

FIELD OF INVENTION

The invention relates generally to the field of semiconductor processing and more specifically to removing oxide from semiconductor wafers.

BACKGROUND OF INVENTION

Silicon dioxide, $SiO_2$, is commonly used as a dielectric material in semiconductor manufacturing. The dielectric may be formed by various methods, such as by plasma deposition, TEOS decomposition and thermal growth. Regardless of the manner of oxide formation, it is necessary to remove or pattern the oxide. One way to pattern oxide is by plasma etching, also known as dry etching, as described in *Plasma Etching*, by Manos and Flamm, copyright 1989, pages 159–165. Another way to pattern oxide is by wet etching as described in *Semiconductor Integrated Circuit Processing Technology*, by Runyan and Bean, copyright 1990, pages 264–266. Hydrofluoric acid (HF) mixed with water and often buffered with ammonium fluoride is a standard silicon dioxide wet etchant. Typically, the semiconductor wafer is immersed into a tank containing the wet etchant and thereafter removed where it may be dipped into other tanks for rinsing or cleaning the wet etchant from the wafer.

A problem with wet etching silicon dioxide and subsequent tank rinsing is particle generation. Particles are small minute bits or pieces of silicon dioxide that remain on the surface of the semiconductor wafer after rinsing. Sometimes, the particles do not necessarily cause problems. However, as linewidths continue to shrink, small particles that may not have affected larger linewidth devices, become more problematical as they do affect smaller linewidth devices. As an example, dynamic random access memories (DRAMs) of the 16 megabit variety are typically manufactured with around 0.5 micron design rules. 64 megabit DRAMs are typically manufactured with around 0.35 micron design rules. 256 megabit DRAMs will be manufactured with around 0.25 micron linewidths and 1 gigabit DRAMs will have even smaller linewidths. See *Semiconductor Memories*, by Prince, copyright 1991, page 114.

Particle control is a problem regardless of the type of memory cell architecture used for the DRAM. Two commonly used types of memory cell architectures are trench type and stack type. These are described in *Semiconductor Memories*, by Prince, copyright 1991, pages 138–141. Another relatively new type of memory cell architecture is the crown. Crown type memory cells are described in the following papers:

1. Crown-Shaped Stacked-Capacitor Cell for 1.5-V Operation 64-Mb DRAM's, by Kaga et al., IEEE Transactions On Electron Devices, Vol. 38 No. 2, February 1991, pages 255–261; and
2. Fabrication Process for Container and Crown Electrodes in Memory Devices, by Kotecki et al., IBM Technical Disclosure Bulletin, Vol. 38 No. 11, November 1995.

Crown type memory cells are discussed in the following U.S. patents:

1. U.S. Pat. No. 5,612,241, issued Mar. 18, 1997 to Arima and assigned to Mitsubishi;
2. U.S. Pat. No. 5,545,582, issued Aug. 13, 1996 to Roh and assigned to Samsung;
3. U.S. Pat. No. 5,491,103, issued Feb. 13, 1996 to Ahn et al. and assigned to Samsung;
4. U.S. Pat. No. 5,354,705, issued Oct. 11, 1994 to Mathews et al. and assigned to Micron;
5. U.S. Pat. No. 5,278,091, issued Jan. 11, 1994 to Fazan et al. and assigned to Micron;
6. U.S. Pat. No. 5,270,241, issued Dec. 14, 1993 to Dennison et al. and assigned to Micron;
7. U.S. Pat. No. 5,238,862, issued Aug. 24, 1993 to Blalock et al. and assigned to Micron; and
8. U.S. Pat. No. 5,162,248m issued Nov. 10, 1992 to Dennison et al. and assigned to Micron.

Prior art FIGS. 1*a–f* show a sequence of manufacturing steps used to make a crown type memory cell. Prior art FIGS. 1*a–f* correspond respectively to FIGS. 7*a–f* of the Kaga et al. IEEE article described in publication 1 above. The following manufacturing description also comes from the Kaga et al. article. To be noted is that a HF solution is used to remove $SiO_2$ in conjunction with FIGS. 1*e* and 1*f*.

Prior art FIG. 1*a* shows a semiconductor substrate 10 having word lines 12 covered by a $SiO_2$ layer 14. After removal of the thin $SiO_2$ layer 14 at the data line contact region 16, polycyrstalline Si 18, $WSi_2$ 20 and $SiO_2$ 22 are deposited on the surface of the wafer using a chemical vapor deposition (CVD) technique as illustrated in prior art FIG. 1*b*.

In the step of prior art FIG. 1*b*, the polycrystalline Si surface 18 is planarized using an etch-back method to make a planar $WSi_2$ surface 20.

Next, the data lines are formed by anisotropic dry etching. Then a sidewall $SiO_2$ region 24 is formed using CVD and an anisotropic dry etching method as illustrated in prior art FIG. 1*c*. During this step, capacitor contacts are automatically formed on the Si surface. Then, selective polycrystalline Si layers 26 are formed on the contacts.

In FIG. 1*d*, a $Si_3N_4$ layer 28 and a $SiO_2$ layer 30 are deposited using CVD. The $Si_3N_4$ layer 28 (about 200 nm) fills both the word-line spaces and data-line spaces. Because these spaces are approximately 0.3 μm, almost a flat $Si_3N_4$ surface can be created.

After $SiO_2/Si_3N_4$ layer deposition, the $SiO_2/Si_3N_4$ layer is etched using anisotropic dry etching. Then a 100 nm thick n-type polycrystalline Si layer 32 is deposited using a phosphorus doped CVD technique as illustrated in FIG. 1*e*.

After filling the holes with $SiO_2$ by using CVD and an etch-back method, the polycrystalline Si layer 32 is anisotropically etched. Then the filled $SiO_2$ and the $SiO_2$ layer 30 on the $Si_3N_4$ layer 28 are removed using a HF solution. Next, a crown-shaped polycrystalline Si electrode is formed. Then, a $Ta_2O_5$ film 34 is deposited using CVD. In this step, a two-step oxygen-ambient annealing method is applied to reduce current leakage and to improve film reliability. Finally, a tungsten film 36 is sputtered as illustrated in FIG. 1*f*.

Kaga et al. is silent as to how the $SiO_2$ layer 30 is removed using a HF solution. Possibly, the wafer was dipped into a solution of HF followed by dipping the wafer into a rinse as described above. However, such technique could possibly generate thousands of particles which could settle back onto the wafer surface. It is also possible that the wafer was put into a vapor HF chamber to remove the oxide.

FSI Corporation of Chaska, Minn., United States of America manufactures an anhydrous vapor HF etcher called the "Excaliber ISR-200". U.S. Pat. No. 4,749,440, issued on Jun. 7, 1988 to Blackwood et al. and assigned to both FSI and Texas Instruments describes an apparatus and process for anhydrous vapor HF processing. Among the advantages provided over wet etching, are uniform, repeatable and controllable etching and smooth surfaces. However, even the advantageous techniques described in the patent may not be enough to successfully minimize particle disruption for ULSI devices such as DRAMS having complex topographies. What is needed is a new technique for advanced wafer oxide cleaning which greatly minimizes particles.

It is accordingly an object of the invention to provide a new method for etching oxide from semiconductor wafer surfaces which minimizes particle defects.

Other objects and advantages of the invention will be apparent to those of ordinary skill in the art having the benefit of the following specification.

SUMMARY OF INVENTION

A two step insitu oxide strip significantly reduces particles and minimizes defective memory cells. Following an inital exposure to vapor HF for oxide removal, a first insitu water rinse occurs. A second exposure to vapor HF then occurs and is followed by a second insitu water rinse. During both the first water rinse and the second water rinse, the wafer may be rotated at increasing speeds which aids in sweeping particles off the wafer surface. Water, rather than water vapor, aids in freeing particles from the wafer surface which may contain complex topographies. The process may be practiced in a commercially available reactor, such as one manufactured by FSI, and is particularly suitable for ULSI devices such as 64 megabit DRAMs employing crown type memory cells.

DETAILED DESCRIPTION OF PREFERRED EMBODIMENT

Figure 1A:
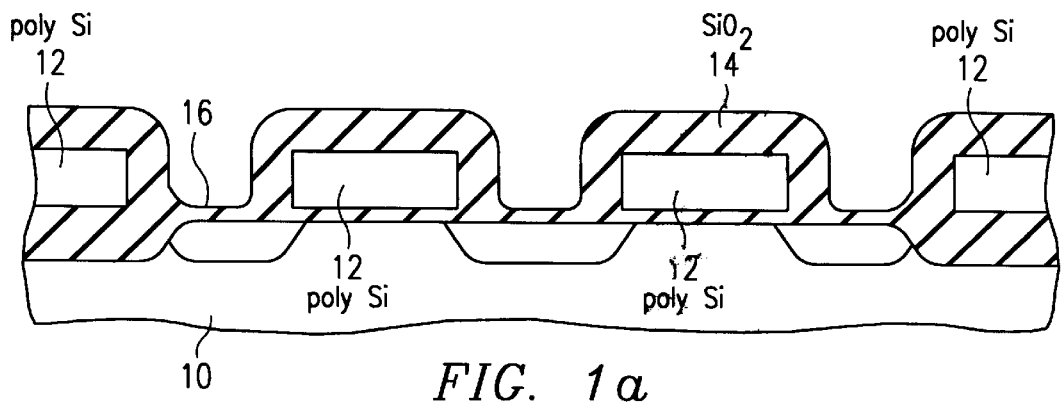
FIGS. 1a–1f are prior art drawings depicting successive steps used to manufacture crown shaped memory devices.
Figure 1B:
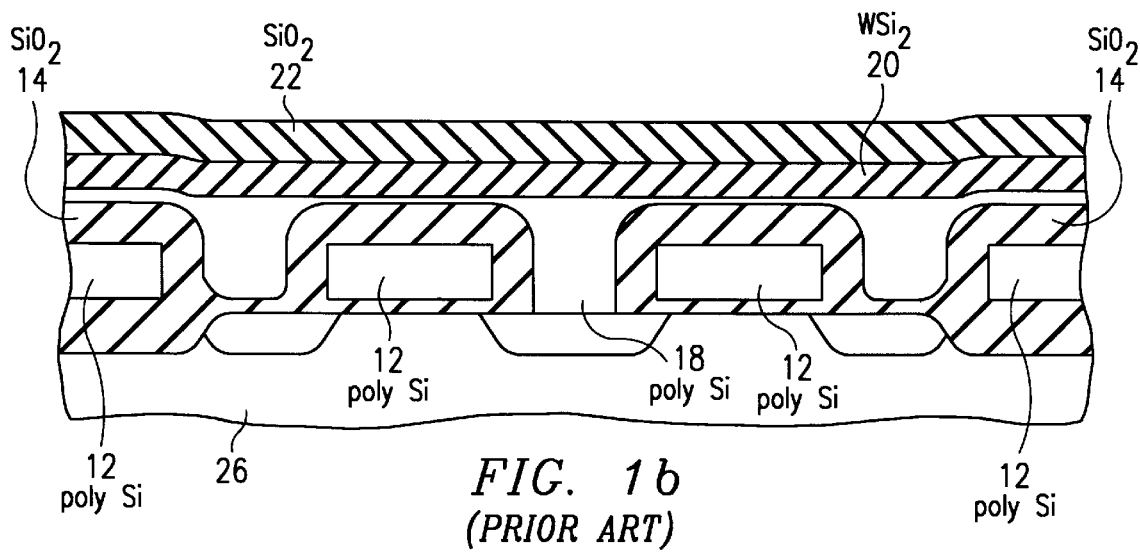
Figure 1C:
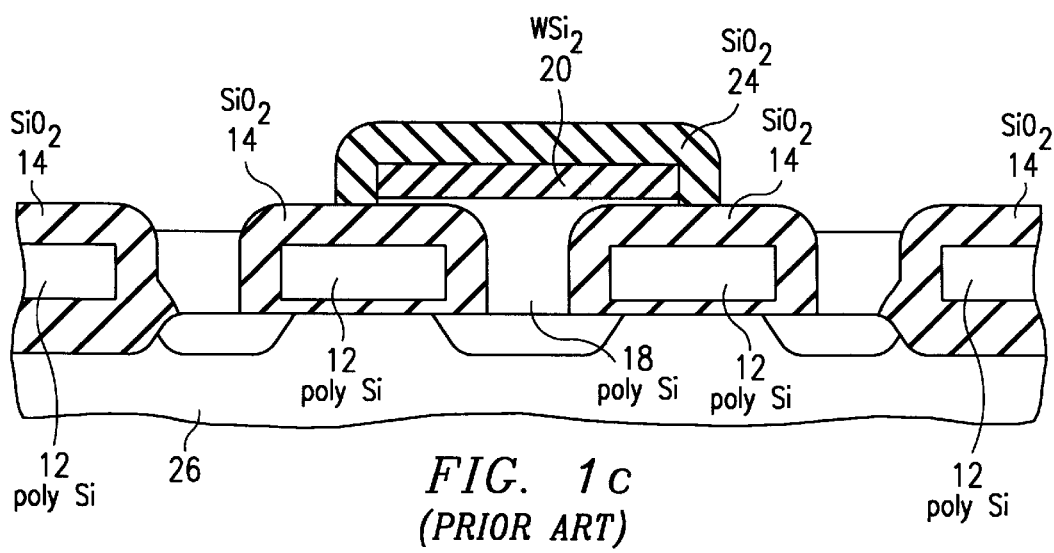
Figure 1D:
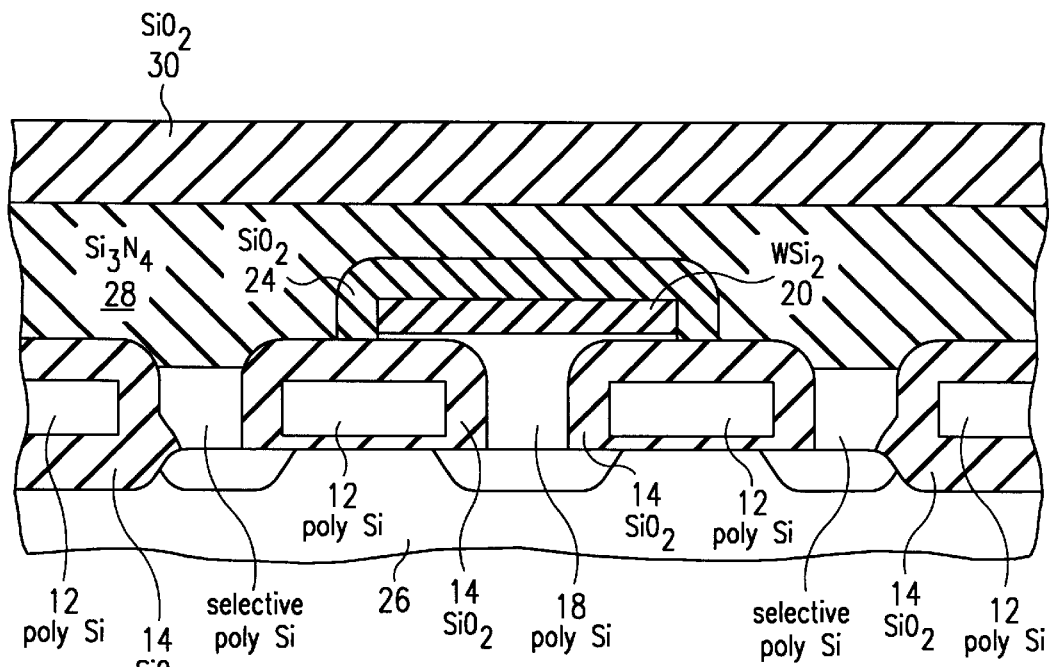
Figure 1E:
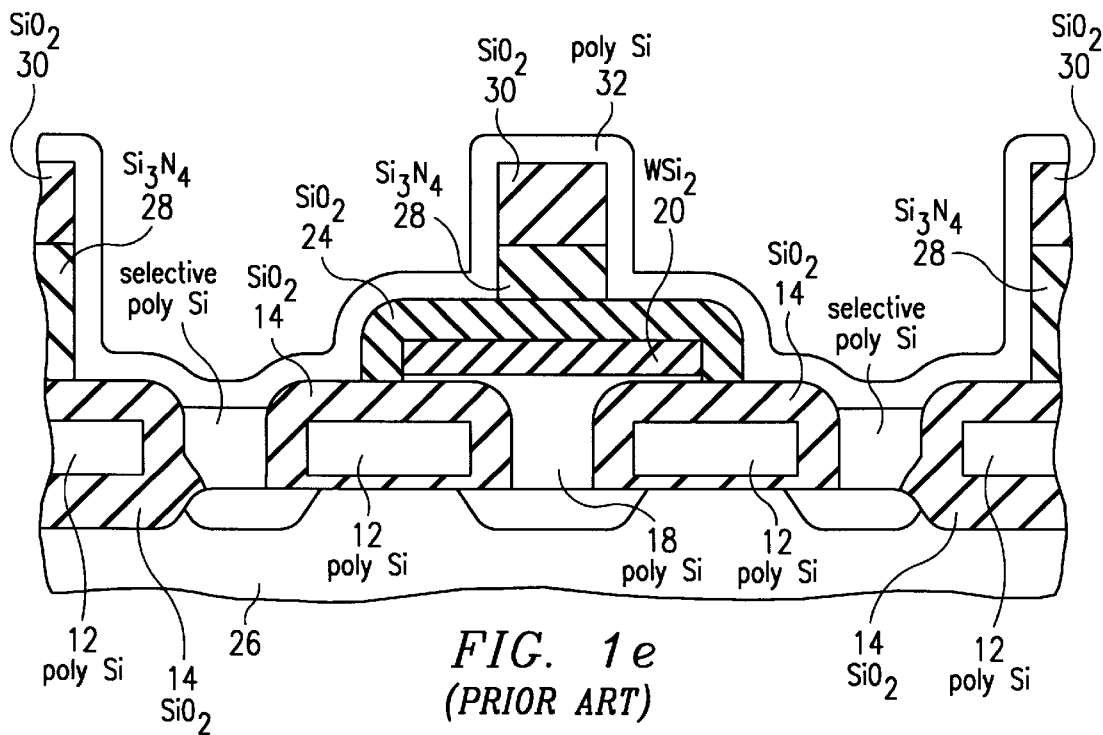
Figure 1F:
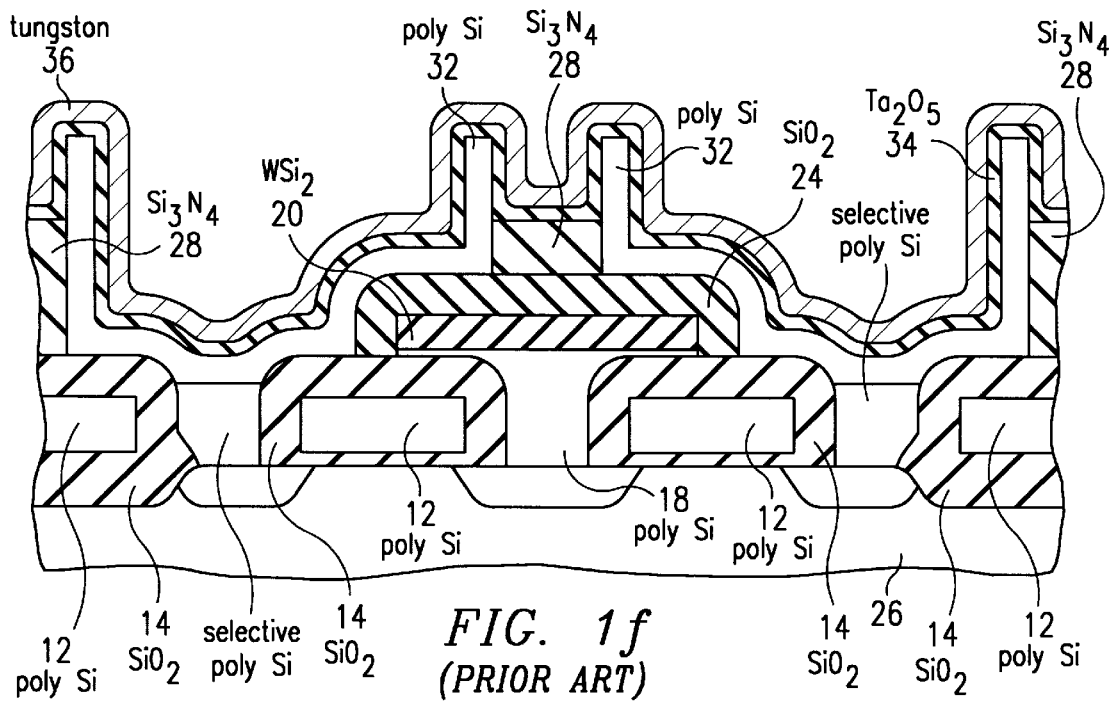
Figure 2:
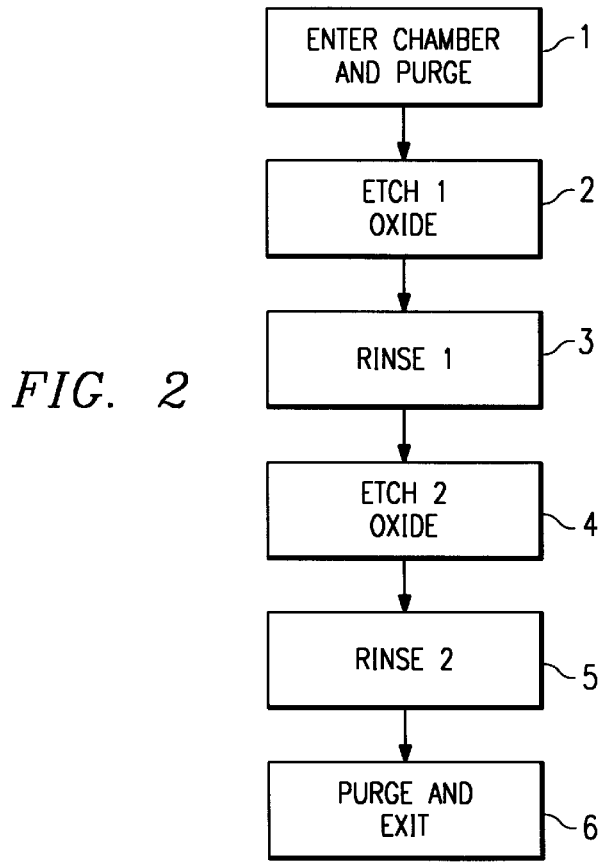
FIG. 2 is a flow chart illustrating the oxide strip process according to a preferred embodiment of the invention.

FIG. 2 depicts, in flow chart form, a two step oxide cleaning process according to the preferred embodiment of the invention. Relating FIG. 2 to prior art FIGS. 1a–1f, the inventive two step oxide cleaning process would be used to remove the oxide layer 30 during the steps shown between FIGS. 1e and 1f during crown cell formation. Of course, crown type memory cells may be made by other processes, some of which are described in the aforementioned U.S. patents. Regardless of the specific process used to manufacture the crown memory cell, each process will implement an oxide strip and thus the inventive two step oxide cleaning process is suitable for all crown memory cell processes. Additionally, the inventive two step oxide strip is not limited to crown memory cells and is applicable to other types of memory cells and to semiconductor processing in general as oxides are widely used.

In the following description, it is to be noted that the ratios between nitrogen, water vapor and HF have been optimized to minimize etch residue. This is particularly desirable when manufacturing complex topography devices. The percentage of water vapor is limited to minimize etch residue. More vapor may be used, however, the etch residue will increase. The following description will show a ratio between inert gas:water vapor:HF on the order of around 120:15:1 respectively. It is believed that ranges on the order of (60–120): (10–20):1 will be sufficient. It is also to be noted that the silicon nitride film 28 functions as an etch stop. Whereas inside memory array area containing the crown cell, a thick oxide layer exists (such as on the order of around 1 microns thick), outside the memory array area in the periphery the oxide layer is much thinner. Hence, during the etch, the periphery is stripped much faster. The underlying nitride functions as an etch stop until oxide from the crown is stripped.

If the etch stop film is oxide (TEOS) instead of nitride, a very high selective etch is required to strip oxide from memory cells. This selectivity can be achieved by reducing water vapor percentage to zero. However, 0% water vapor can work on oxides such as PSG (phosphorous doped silicate glass). In general, water vapor is required to start the etch reaction between oxide and HF. However, in case of PSG, there is enough moisture adsorbed in the PSG film to begin the reaction between PSG and HF. Not only that, in this case, the etch process is much faster because there is no outside water vapor to slow down the reaction to. Hence, this oxide strip can become a highly selective etch. In this case, the underneath oxide should be undoped oxide such as TEOS, which will work as an etch stop with very minimum oxide loss. The TEOS requires moisture for vapor HF etch. After clearing the PSG oxide, the water vaporless vapor HF etch will stop on the underlying TEOS layer. It is to be noted that while this type of PSG/TEOS arrangement can be etched in a single step with a vapor HF water vaporless etch, a two step etch, as below described, is recommended to minimize etch by-products.

In FIG. 2, in step 1, the semiconductor wafer enters the cleaning chamber, the chamber is closed and a gaseous nitrogen purge occurs. The chamber may be a commercially available vapor HF cleaning system such as the Excalibur ISR-200 manufactured by FSI and as described in previously mentioned U.S. Pat. No. 4,749,440. Upon entering the chamber, the wafer would be placed upon a chuck which is capable of rotation. The backside of the wafer rests upon the chuck and the frontside of the wafer having the memory cell thereon is exposed. The chamber is closed, and a gas, such as nitrogen, is blown across the wafer frontside. Pressure within the chamber is reduced to about 0.635 atm and the temperature of the chuck is heated to about 30° C. Etch rate can be increased or decreased by decreasing or increasing N2 flow respectively. Higher etch rate can have some negative impact such as etch uniformity within wafer and wafer to wafer etch uniformity.

In FIG. 2, in step 2, the first oxide cleaning occurs. The Excalibur is set for a 60 second etch with the following conditions. Nitrogen flow is 40% of 30 liters per minute across the frontside of the wafer. Water vapor is 18% of 10 liters per minute. HF through a first mass flow controller is 40% of 250 cubic centimeters per minute. No HF flows through a second mass flow controller. Nitrogen flow is 50% of 2 liters per minute across the backside of the wafer resting upon the chuck. After the 60 second etch, a 10 second etch occurs with the same conditions. (The FSI machine has a software limitation which restricts the etch time to no more than 60 seconds.) This allows ~55% of the etch to complete before starting the first rinse.

In FIG. 2, after the 10 second etch, HF is shutdown and nitrogen flow across the frontside of the wafer is reduced to about 20% for about one second while nitrogen flow across the backside of the wafer continues at about 50%. The machine is purged for about another second with the same conditions.

In FIG. 2, in step 3, the first insitu rinse next occurs. Without leaving the chamber, the first rinse begins with a 20% flow of (0–30 LPM MFC) nitrogen across the wafer frontside for 1 second while the wafer rotates slowly at about 20 revolutions per minute (rpm). No water is sprayed on the wafer frontside during this initial spin. During a second spin, the rotation speed is increased to about 700 rpm for about 15 seconds while deionized water is sprayed onto the wafer frontside with continued nitrogen flow. The water spray flow is about 500 cc/min. A third spin next occurs with rotation speed increasing to about 1000 rpm for about 25 seconds with continued deionized water spray onto wafer frontside and continued nitrogen flow. A fourth spin further increases to about 3000 rpm for about 20 seconds to dry the wafer. Nitrogen flow continues while deionized water spray is discontinued. The deionized water spray is more effective than a water vapor in dislodging particles. It effectively removes any solid etch byproducts while helping achieve good etch uniformity. Water vapor is less effective in removing particles lodged around the crown base than water spray. Etch uniformity can be impacted if HF vapor is used during rinse. On the other hand, if the etch residue is insoluble in DI water, few seconds of HF vapor can be used to dissolve this residue and remove from wafer surface. Increasing the wafer rotation speed aids in sweeping the dislodged particles from the wafer surface.

It is important that the oxide cleaning be broken into two steps as opposed to a single etch followed with a rinse. With a device such as a crown cell, a single etch allows numerous etch by products to "pile up" around the crown base or stem. During the following rinse, many crowns are broken. A two step cleaning process prevents a mass of particles from piling up around the base. The first rinse removes particles from the base generated from the first etch. Some of the etch residue is solid and keeps growing as more etch occurs. It is improtant that this residue is rinsed off with insitu intermediate rinse. If this residue is not rinsed, it can put stress on the standing crowns and damage the crown structures such as lift the crowns or pinch off the crowns from the storage node contacts. The second rinse removes particles from the second etch and any remaining particles not removed by the first rinse.

In FIG. 2, in step 4, the second oxide cleaning step occurs. The Excalibur is set for a time suffficient to finish the oxide removal. This will be about 45% of the total etch since the first etch removed about 55% of the oxide. Nitrogen flow is 40% of 30 liters per minute across the frontside of the wafer. Water vapor is reduced to about 10% of 10 liters per minute. HF through a first mass flow controller is 40% of 250 cubic centimeters per minute. No HF flows through a second mass flow controller. Nitrogen flow is 50% of 2 liters per minute across the backside of the wafer resting upon the chuck. After the 60 second etch, HF is turned off and chamber is purged with N2 for 2 secs. During this etch, HF flow is stopped and nitrogen flow is reduced to about 20%.

In FIG. 2, after the 2 second purge, the machine is shutdown for one second, during which time, HF is turned off and nitrogen flows across the frontside of the wafer reduced to about 20% while nitrogen flow across the backside of the wafer continues at about 50%. The machine is purged for one second with the same conditions.

In FIG. 2, in step 5, the second insitu rinse next occurs. Again, without leaving the chamber, the second rinse begins with a 1 second flow of nitrogen across the wafer frontside while the wafer rotates slowly at about 20 revolutions per minute (rpm). No water is sprayed on the wafer frontside during this initial spin. During a second spin, the rotation speed is increased to about 1000 rpm for about 60 seconds while deionized water is sprayed onto the wafer frontside with continued nitrogen flow. The water spray flow is about 500 cc/min. A third spin next ocurs with rotation speed increasing to about 1500 rpm for about 30 seconds with continued deionized water spray onto wafer frontside and continued nitrogen flow. A fourth spin further increases to about 2000 rpm for about 30 seconds. Nitrogen flow continues and deionized water spray is continues. A fifth spin further increases rotation speed to about 3000 rpm for 40 seconds. Nitrogen flow continues and deionized water spray is discontinued.

In step 6, the reaction chamber is purged with nitrogen flow, the chamber is opened and the wafer is removed. Thereafter, further processing will occur to finish construction of the memory cell.

While the invention has been described with reference to illustrative embodiments, this description is not intended to be construed in a limiting sense. Various other embodiments of the invention will be apparent to persons skilled in the art upon reference to this description. For example, the intermediate rinse may be repeated several times, such as a third, fourth or more as needed to assure the complete removal of residues from under the base of the crown in order to prevent crown lifting. Also, other oxide etches typically include those for contact and via. A contact is usually thought of as an opening in a dielectric layer to an underlying transistor and a via is usually thought of as an opening in a dielectric layer that separates two conductive layers. As aspect ratios for contacts and vias continue to shrink, a multistep vapor etch/water stream rinse sequence may prove beneficial. It is also envisioned that a multistep vapor etch/stream rinse sequence will be beneficial for materials other than oxide, such as other dielectric films, polysilicon and metal, where polymer removal is problematical. Liquids other than 100% deionized water may be utilized in cleaning. Examples of non 100% deionized water include solvents such as dilute $HF:H_2O$ mixture in the ratio of approximately 1:1000 to 1:10000, isopropyl alcohol, a mixture of isopropyl alcohol and water, and a mixture of dilute HF and isopropyl alcohol in the ratio of approximately 1:1000 to 1:10000. The liquid, whatever its type, should be in a stream—not a vapor and not a bath—to obtain the advantages above described. It is further envisioned to use such vapor etch and intermediate stream rinse not only on semiconductor wafers, but in manufacturing other devices such as, for example, hard disk drives and compact disks. It is therefore contemplated that the appended claims will cover any such modifications of the embodiments as fall within the true scope and spirit of the invention.

What is claimed is:

1. A method of removing silicon dioxide from the surface of a semiconductor wafer, comprising the steps of:
   providing a semiconductor wafer having an oxide layer over the surface of the semiconductor wafer;
   disposing said wafer having said oxide layer in a chamber and exposing the oxide layer for a first time to a hydrofluoric acid vapor in a chamber to etch a portion of the oxide layer;
   then stopping the exposure to said hydrofluoric acid vapor before the oxide layer is completely removed;
   then performing a first in-situ water rinse in the chamber to clean the semiconductor wafer to remove particles from said semiconductor wafer resulting from said exposure to hydrofluoric acid vapor and to minimize build-up of said particles on the surface of said semiconductor wafer;
   then, prior to performing other processing steps on said semiconductor wafer, exposing the remaining portion of said oxide layer for a second time to a hydrofluoric acid vapor in the chamber;

again, prior to performing other processing steps on said semiconductor wafer, stopping said exposure to a hydrofluoric acid vapor when the oxide layer is further and substantially completely removed; and then performing a second in-situ water rinse in the chamber to clean the semiconductor wafer to remove particles from said semiconductor wafer resulting from said exposure to said hydrofluoric acid vapor.

2. The method of claim 1 wherein during the first in-situ water rinse, the semiconductor wafer is initially rotated at a first speed; and wherein during the second in-situ water rinse, the semiconductor is initially rotated a second speed which is faster than the first speed.

3. The method of claim 2 wherein the first speed is approximately 700 revolutions per minute and the second speed is approximately 1000 revolutions per minute.

4. The method of claim 1 wherein the first in-situ water rinse occurs for a first time and the second in-situ water rinse occurs for a second time which is longer than the first time.

5. The method of claim 4 wherein the first time is approximately 1 minute and the second time is approximately 2½ minutes.

6. A method of removing oxide from a partially formed memory capacitor, comprising the steps of:

providing a semiconductor wafer having a partially formed memory capacitor on a surface thereof with a polysilicon layer overlying an oxide layer;

etching the polysilicon layer to expose the oxide layer;

placing the semiconductor wafer into a chamber and partially removing the oxide layer with a first hydrofluoric acid vapor etch for a first time;

then performing a first in-situ water rinse in the chamber to clean the semiconductor wafer to remove particles from said semiconductor wafer resulting from said exposure to hydrofluoric acid vapor and to minimize build-up of said particles on the surface of said semiconductor wafer;

then, prior to performing other processing steps on said semiconductor wafer, finishing the removal of the oxide layer with a second hydrofluoric acid vapor etch; and then performing a second in-situ water rinse in the chamber to clean the semiconductor wafer to remove particles from said semiconductor wafer resulting from said exposure to hydrofluoric acid vapor; and the completing processing of said semiconductor wafer.

7. The method of claim 6 wherein the first vapor hydrofluoric acid etch removes about 50% of the oxide.

8. The method of claim 7 wherein the partially formed memory cell is of the crown type memory cell.

9. The method of claim 8 wherein the first in-situ water rinse occurs for a first time and the second in-situ water rinse occurs for a second time that is longer than the first time.

10. The method of claim 9 wherein the first time is about 1 minute and the second time is about 2½ minutes.

11. The method of claim 10 wherein during the first in-situ water rinse, the wafer rotates and a first speed and during the second in-situ water rinse, the wafer rotates at a second speed that is faster than the first speed.

12. The method of claim 11 wherein the first speed is about 700 rpm and the second speed is about 1000 rpm.

* * * * *